United States Patent
Chen et al.

(10) Patent No.: US 12,046,492 B2
(45) Date of Patent: Jul. 23, 2024

(54) ROBOT BLADE TILT DETERMINATION BY EVALUATING GRAYSCALE IN IMAGES

(71) Applicant: Winbond Electronics Corp., Taichung (TW)

(72) Inventors: Yi-Ta Chen, Taichung (TW); Wen-Chin Hsieh, Taichung (TW)

(73) Assignee: Winbond Electronics Corp., Taichung (TW)

( * ) Notice: Subject to any disclaimer, the term of this patent is extended or adjusted under 35 U.S.C. 154(b) by 353 days.

(21) Appl. No.: 17/380,017

(22) Filed: Jul. 20, 2021

(65) Prior Publication Data

US 2022/0044947 A1 Feb. 10, 2022

(30) Foreign Application Priority Data

Aug. 5, 2020 (TW) .................................. 109126568

(51) Int. Cl.
*H01L 21/67* (2006.01)
*B25J 9/16* (2006.01)
(Continued)

(52) U.S. Cl.
CPC ...... *H01L 21/67259* (2013.01); *B25J 9/1674* (2013.01); *B25J 11/0095* (2013.01);
(Continued)

(58) Field of Classification Search
CPC ............. H01L 21/67259; H01L 21/681; H01L 21/67288; H01L 21/67778; B25J 9/1674;
(Continued)

(56) References Cited

U.S. PATENT DOCUMENTS

| 6,542,839 B1* | 4/2003 | Lu ..................... H01L 21/67259 |
|---|---|---|
| | | 250/559.38 |
| 6,808,589 B2 | 10/2004 | Su et al. |

(Continued)

FOREIGN PATENT DOCUMENTS

| CN | 104752295 | 7/2015 |
|---|---|---|
| CN | 110729211 | 1/2020 |

(Continued)

OTHER PUBLICATIONS

Huang; Zike, "Accuracy Design of Transferring Robot's for Wet-bench", Mechatronics, with English abstract, Jan. 15, 2018, pp. 46-51, vol. 1.

(Continued)

*Primary Examiner* — Hwa Andrew Lee
(74) *Attorney, Agent, or Firm* — JCIPRNET

(57) ABSTRACT

A transportation monitoring method is provided, including the following steps. A monitoring image of a robot blade outside a carrier is captured from a fixed field of view by an image capturing device. The robot blade is configured to move an item into or out of the carrier. Next, a sampling area is obtained from the monitoring image by a processing device. Also, a tilting state of the robot blade is determined according to the sampling area by the processing device. When the processing device determines that the robot blade is tilted, the processing device sends a warning signal. A transportation monitoring system is also provided.

16 Claims, 3 Drawing Sheets

(51) Int. Cl.
*B25J 11/00* (2006.01)
*B25J 19/02* (2006.01)
*G06T 7/00* (2017.01)
*G06T 7/90* (2017.01)
*H01L 21/68* (2006.01)

(52) U.S. Cl.
CPC ........... *B25J 19/023* (2013.01); *G06T 7/0004* (2013.01); *G06T 7/90* (2017.01); *H01L 21/681* (2013.01)

(58) Field of Classification Search
CPC ... B25J 11/0095; B25J 19/023; G06T 7/0004; G06T 7/90; G06T 2207/30164; G06T 7/73
See application file for complete search history.

(56) References Cited

U.S. PATENT DOCUMENTS

| | | | |
|---|---|---|---|
| 6,965,432 B2 | 11/2005 | Wu et al. | |
| 7,248,931 B2 | 7/2007 | Raaijmakers | |
| 8,303,231 B2 | 11/2012 | Yu et al. | |
| 8,544,651 B2 | 10/2013 | Zhang et al. | |
| 9,786,530 B2 | 10/2017 | Lee et al. | |
| 2006/0178009 A1 | 8/2006 | Tanaka | |
| 2007/0260341 A1 | 11/2007 | Wu et al. | |
| 2012/0271590 A1 | 10/2012 | Sakhare et al. | |
| 2021/0366102 A1* | 11/2021 | Park | G06T 7/0004 |

FOREIGN PATENT DOCUMENTS

| | | | | |
|---|---|---|---|---|
| KR | 20070047606 | | 5/2007 | |
| KR | 20120133031 | | 12/2012 | |
| KR | 20160124965 A | * | 10/2016 | ....... H01L 21/67742 |
| TW | 200818382 | | 4/2008 | |
| TW | 201413214 | | 4/2014 | |
| TW | 201440980 | | 11/2014 | |

OTHER PUBLICATIONS

"Office Action of China Counterpart Application", issued on Apr. 19, 2024, p. 1-p. 10.

* cited by examiner

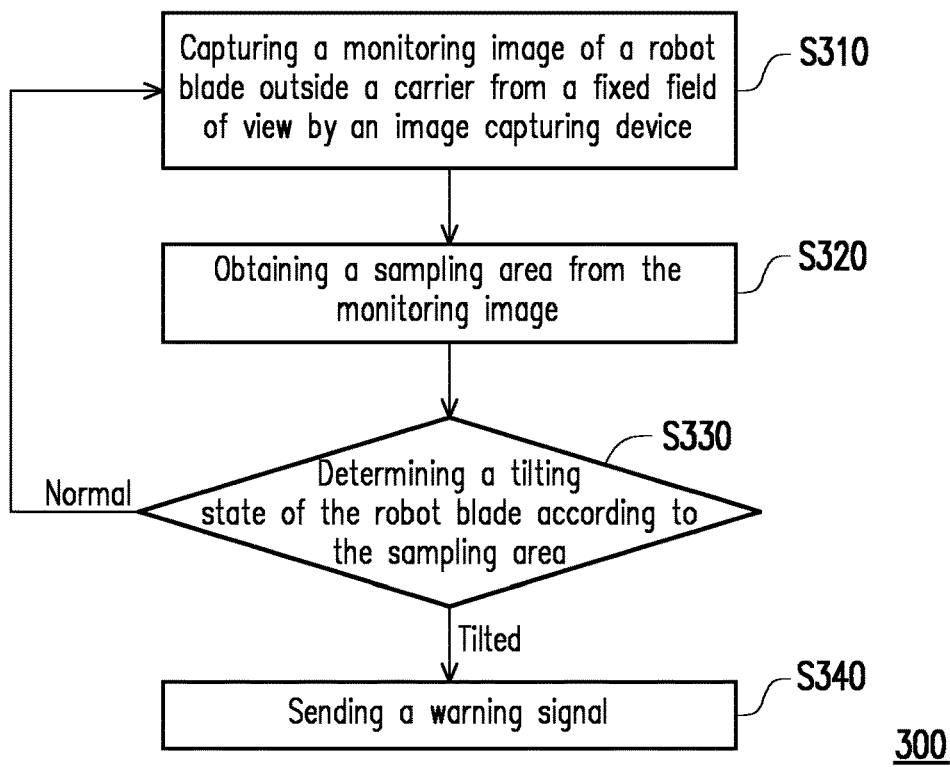
FIG. 3
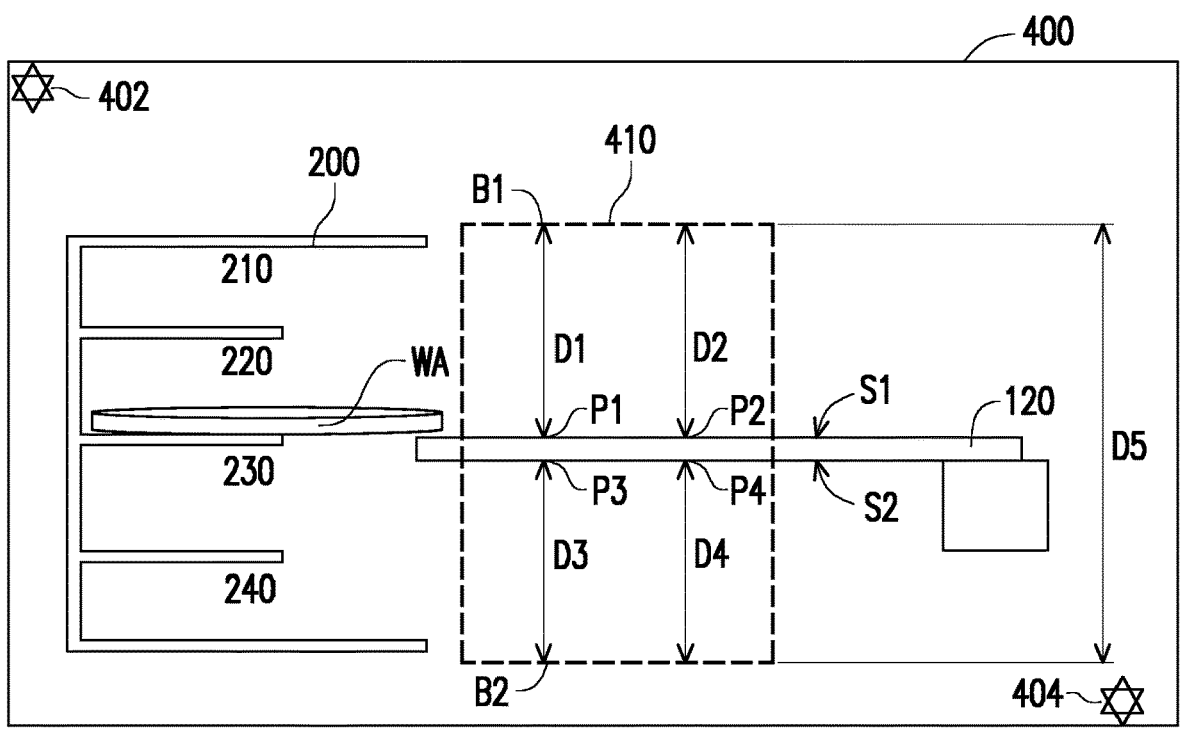
FIG. 4
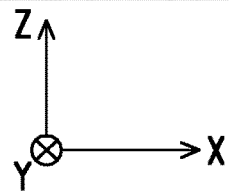

ROBOT BLADE TILT DETERMINATION BY EVALUATING GRAYSCALE IN IMAGES

CROSS-REFERENCE TO RELATED APPLICATION

This application claims the priority benefit of Taiwan application serial no. 109126568, filed on Aug. 5, 2020. The entirety of the above-mentioned patent application is hereby incorporated by reference herein and made a part of this specification.

BACKGROUND

Technical Field

The disclosure relates to an item transportation technology. Particularly, the disclosure relates to a transportation monitoring method and a system thereof.

Description of Related Art

Generally, during manufacturing processes of semiconductors, wafers are transported between process modules and storage modules. When a wafer is loaded into process equipment, a robot blade is employed to move the wafer out of a front opening unified pod (FOUP) and transfer the wafer to a process reaction chamber for a process reaction. After the process is finished, the wafer is returned to the FOUP. However, if the robot blade is tilted or deviated in position, the wafer may be scratched when being removed and placed, resulting in a defective product. Therefore, in order to prevent damage to the wafer, the manner for monitoring a status of the robot blade in real time during transportation has become a very important issue.

SUMMARY

The disclosure provides a transportation monitoring method and a system thereof, which monitors in real time whether a robot blade is tilted to prevent the robot blade from damaging an item during the transportation process.

An embodiment of the disclosure proposes a transportation monitoring method, which includes the following steps. Firstly, a monitoring image of a robot blade outside a carrier from a fixed field of view is captured by an image capturing device. The robot blade is configured to move an item into or out of the carrier. Next, a sampling area from the monitoring image is obtained by a processing device. Also, a tilting state of the robot blade is determined by the processing device according to the sampling area. The processing device sends a warning signal when the processing device determines that the robot blade is tilted.

An embodiment of the disclosure provides a transportation monitoring system including an image capturing device and a processing device. The image capturing device is configured to capture a monitoring image of a robot blade outside a carrier from a fixed field of view. The robot blade is configured to move an item into or out of the carrier. The processing device is electrically connected to the image capturing device and the robot blade, and is configured to determine a tilting state of the robot blade according to a sampling area of the monitoring image. The processing device sends a warning signal when the processing device determines that the robot blade is tilted.

Based on the above, the transportation monitoring method and the system thereof proposed by the embodiments of the disclosure capture an image of the robot blade outside the carrier as the monitoring image, where the field of view of the monitoring image is fixed, to perform the image processing operation on the monitoring image and extract a sampling range therefrom. The processing device determines the tilting state of the robot blade according to the sampling area of the monitoring image, and sends a warning signal accordingly to remind the operator that the robot blade is tilted.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 3 is a schematic diagram of a transportation monitoring method according to an embodiment of the disclosure.

FIG. 4 is a schematic diagram of a monitoring image according to an embodiment of the disclosure.

DESCRIPTION OF THE EMBODIMENTS

Figure 1:
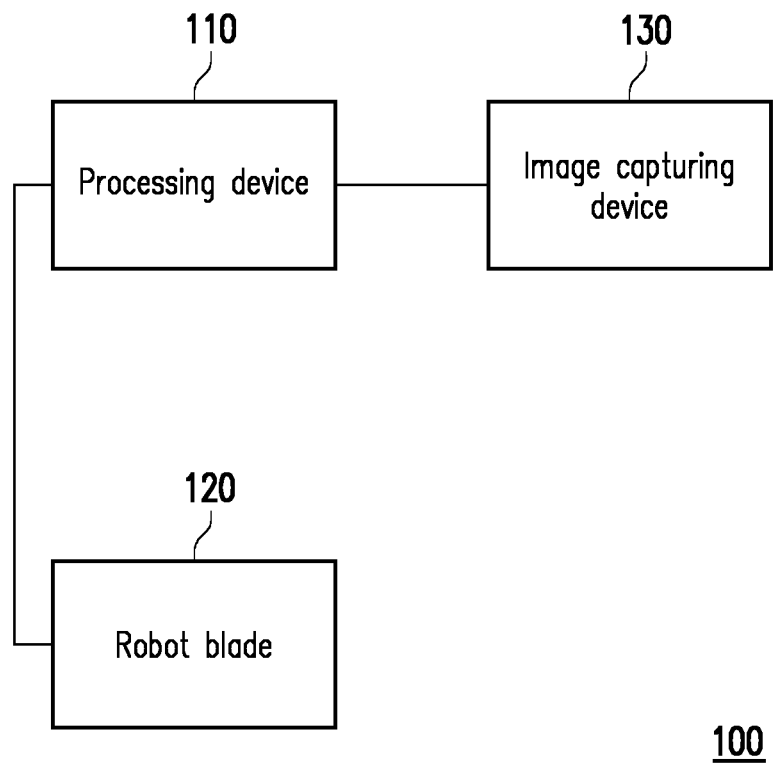
FIG. 1 is a schematic diagram of a transportation monitoring system according to an embodiment of the disclosure.
Figure 2:
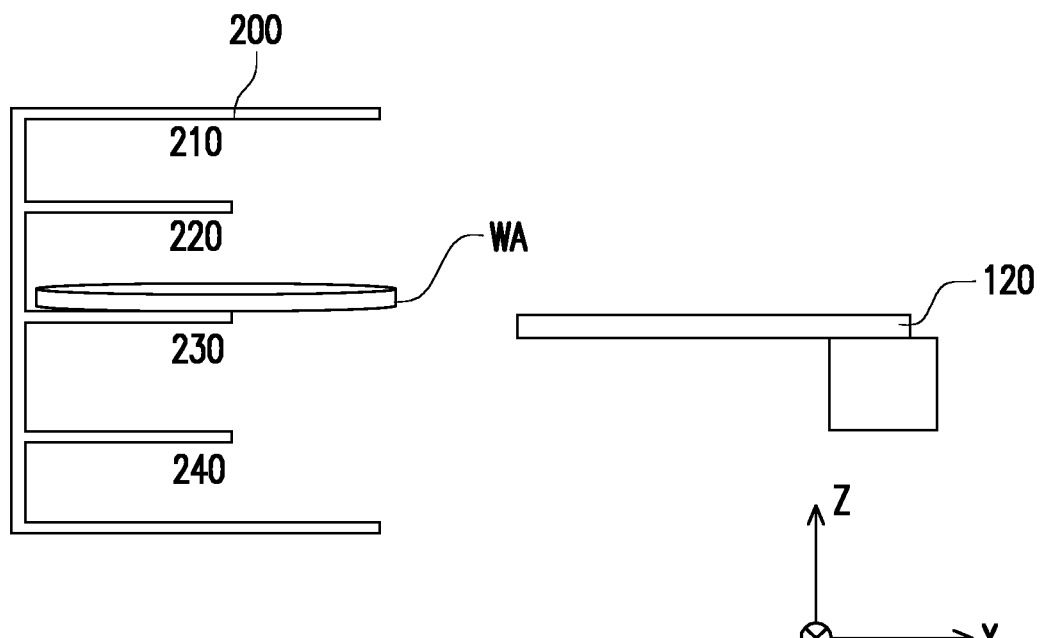
FIG. 2 is a schematic diagram of a wafer transportation process according to an embodiment of the disclosure.

Referring to FIG. 1 and FIG. 2 together, a transportation monitoring system 100 is configured to monitor a tilting state of the robot blade 120. The robot blade 120 is configured to move items into or out of a carrier. The transportation monitoring system 100 includes a processing device 110 and an image capturing device 130. The processing device 110 is electrically connected to the robot blade 120 and the image capturing device 130.

The transportation monitoring system 100 is applied to a wafer transfer system shown in FIG. 2. In FIG. 2, an item WA is a wafer, and a carrier 200 is a FOUP. The robot blade 120 may feed the wafer into the FOUP or remove the wafer from the FOUP. The FOUP (the carrier 200) has a plurality of housing slots (e.g., four housing slots 210 to 240). The housing slots 210 to 240 are arranged along a Z direction and accommodate wafers separately.

The robot blade 120 at different heights in the Z direction may respectively correspond to the housing slots 210 to 240 in the FOUP to select to move the wafer out or into the corresponding housing slot. The robot blade 120 extends in an X direction. In other words, the wafer can lie flat on an XY plane of the robot blade 120.

The image capturing device 130 may include, for example, a charge coupled device (CCD) or a complementary metal-oxide-semiconductor (CMOS) image sensor. The image capturing device 130 is disposed adjacent to the carrier 200 and is configured to capture an image of the robot blade 120 to generate at least one monitoring image. The processing device 110 may include, for example, a central processing unit (CPU), or any other programmable general-purpose or special-purpose microprocessor, a digital signal processor (DSP), a programmable controller, an application specific integrated circuit (ASIC), or any other similar element or a combination of the abovementioned elements. The disclosure is not limited thereto. The processing device 110 processes the monitoring image to determine whether the robot blade 120 is tilted or whether a position of the robot blade 120 is correct.

The transportation monitoring system 100 is suitable for implementing a transportation monitoring method 300 shown in FIG. 3. The implementation of the transportation monitoring method 300 will be described in the following with the reference numerals of the transportation monitoring system 100.

In step S310, the image capturing device 130 captures the monitoring image of the robot blade 120 outside the carrier 200 from a fixed field of view. That is to say, the image capturing device 130 has a fixed capturing angle and a fixed capturing range. In an embodiment, the image capturing device 130 captures the monitoring image before the robot blade 120 moves the item WA (e.g., a wafer) out of the carrier 200. In other words, the monitoring image is an image captured when the robot blade 120 is about to extend into the carrier 200, but has yet extended therein, to remove the item WA. Next, in step S320, the processing device 110 receives the monitoring image from the image capturing device 130, and obtains a sampling area from the monitoring image. In the following embodiments, how the sampling area is obtained will be further describe. In step S330, the processing device 110 determines the tilting state of the robot blade 120 according to the sampling area of the monitoring image. If the processing device 110 determines that the robot blade 120 is not tilted and is operating in a normal condition, the workflow returns to step S310 to continue to monitor the robot blade 120. When the processing device 110 determines that the robot blade 120 is tilted, the workflow enters step S340, and the processing device 110 sends a warning signal. In this embodiment, the processing device 110 may send a warning signal to a fault detection and classification (FDC) control host of the wafer transfer system to alert an operator that the robot blade 120 is abnormal. In response to the warning signal, the robot blade 120 may also automatically discontinue subsequent operations to prevent accidents from occurring when the wafer is being removed.

Referring to FIG. 4, after receiving a monitoring image 400, the processing device 110 performs an image processing operation on the monitoring image 400 to extract a sampling area 410 from the monitoring image 400 and obtain a plurality of grayscale values of the sampling area 410. For example, the processing device 110 performs a grayscale conversion operation to convert the monitoring image 400 into a grayscale image. In this embodiment, the sampling area 410 is a fixed pixel range of the monitoring image 400. Therefore, the processing device 110 can extract the sampling area 410 from the converted monitoring image 400 according to a predetermined pixel coordinate, and obtain the plurality of grayscale values of the sampling area 410. The processing device 110 performs image recognition according to the plurality of grayscale values to determine a position of the robot blade 120 in the sampling area 410. The robot blade 120 usually exhibits a metallic color in its appearance and thus has a relatively high grayscale value. Based on this property, the processing device 110 may identify the robot blade 120 through a grayscale difference.

The processing device 110 obtains at least two pixel coordinates of the robot blade 120 according to the plurality of grayscale values, and determines the tilting state of the robot blade 120 according to the at least two pixel coordinates. The disclosure does not limit the number of pixel coordinates obtained by the processing device 110. In FIG. 4, the processing device 110 obtains four pixel coordinates P1 to P4 of the robot blade 120. In other embodiments, the processing device 110 may obtain two pixel coordinates or more pixel coordinates of the robot blade 120.

The processing device 110 calculates distances D1 to D4 from the pixel coordinates P1 to P4 to boundaries of the sampling area 410, and determines whether the robot blade 120 is tilted and a tilting type thereof according to at least two of the distances D1 to D4.

Figure 5:
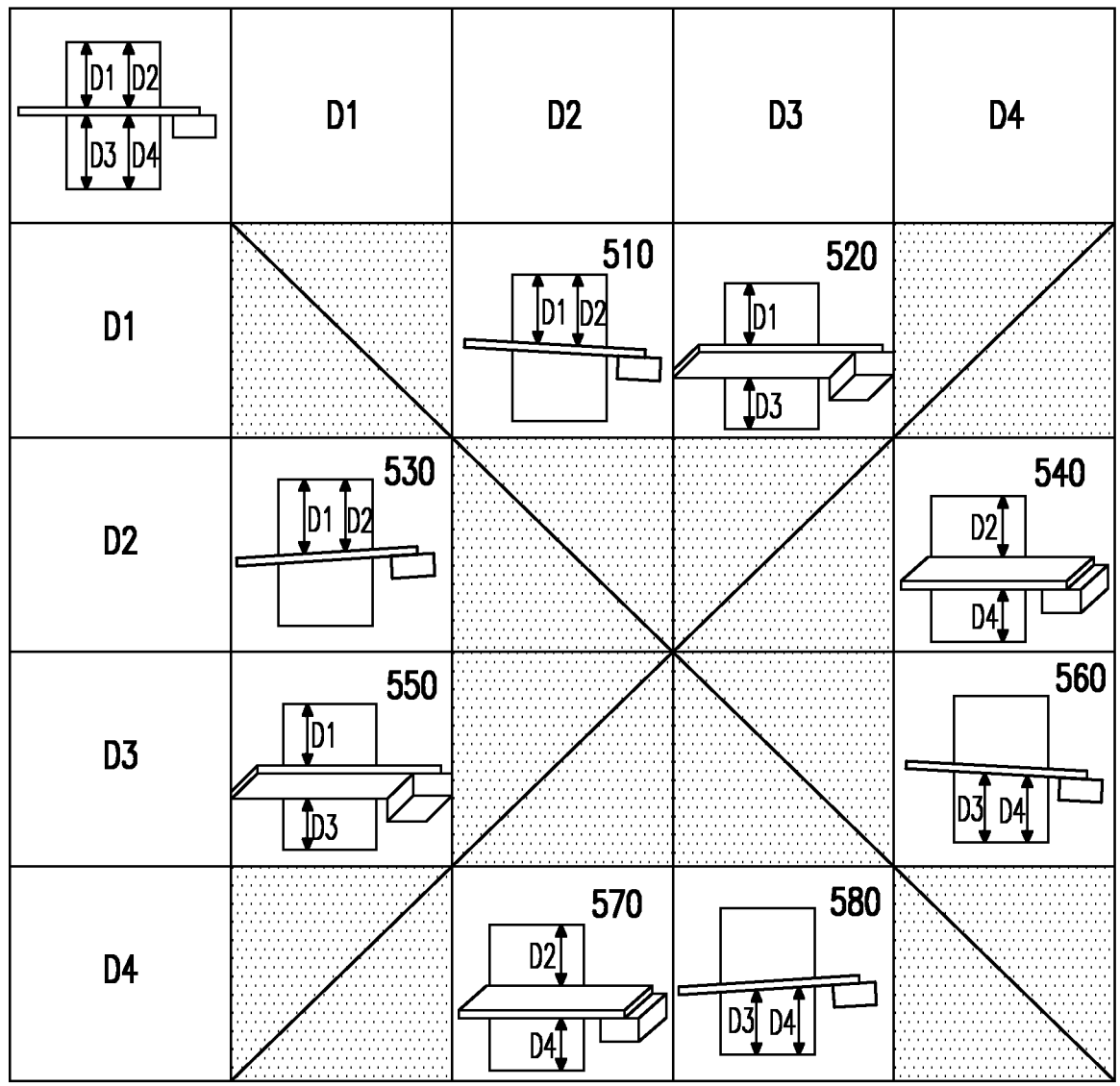
FIG. 5 is a schematic diagram of a tilting type of a robot blade according to an embodiment of the disclosure.

With reference to FIG. 5 accompanied with FIG. 4, a coordinate P1 and a coordinate P2 shown in FIG. 4 are two pixel coordinates located at different positions on a first surface S1 of the robot blade 120, hereinafter referred to respectively as a first pixel coordinate P1 and a second pixel coordinate P2. More specifically, the first pixel coordinate P1 and the second pixel coordinate P2 respectively represent positions at different lengths, namely different positions in the X direction, of the robot blade 120. In another embodiment, the first pixel coordinate P1 and the second pixel coordinate P2 respectively represent positions at different lengths, namely different positions in the X direction and the same position in a Y direction, of the robot blade 120. The first pixel coordinate P1 is located at a front end of the robot blade 120, and the second pixel coordinate P2 is located at a rear end of the robot blade 120. The distance from the first pixel coordinate P1 to a boundary B1 of the sampling area 410 is referred to as the first distance D1, and the distance from the second pixel coordinate P2 to the boundary B1 of the sampling area 410 is referred to as the second distance D2. The processing device 110 determines whether the robot blade 120 is tilted in a front-rear orientation according to a difference between the first distance D1 and the second distance D2. In an embodiment, the difference between the first distance D1 and the second distance D2 is greater than a threshold value, and the processing device 110 determines that the robot blade 120 is tilted in a front-rear orientation and sends the warning signal.

For example, if the first distance D1 is greater than the second distance D2, the processing device 110 determines that the robot blade 120 is tilted in the front-rear orientation, and that the robot blade 120 is tilted downward as shown by a tilting type 530 in FIG. 5. If the first distance D1 is less than the second distance D2, the processing device 110 still determines that the robot blade 120 is tilted in the front-rear orientation, and that the robot blade 120 is tilted upward as shown by a tilting type 510 in FIG. 5.

Coordinates P3 and P4 shown in FIG. 4 are two pixel coordinates located at different positions on a second surface S2 of the robot blade 120, hereinafter referred to respectively as a third pixel coordinate P3 and a fourth pixel coordinate P4. The second surface S2 is relative to the first surface S2. Herein, the first surface S1 is an upper surface of the robot blade 120, and the second surface S2 is a lower surface of the robot blade 120. More specifically, the third pixel coordinate P3 and the fourth pixel coordinate P4 respectively represent positions at different lengths, namely different positions in the X direction, of the robot blade 120. In another embodiment, the third pixel coordinate P3 and the fourth pixel coordinate P4 respectively represent positions at different lengths, namely different positions in the X direction and the same positions in the Y direction, of the robot blade 120. The third pixel coordinate P3 is located at the front end of the robot blade 120, and the fourth pixel coordinate P4 is located at the rear end of the robot blade 120. The distance from the third pixel coordinate P3 to a boundary B2 of the sampling area 410 is referred to as the third distance D3, and the distance from the fourth pixel coordinate P4 to the boundary B2 of the sampling area 410 is referred to as the fourth distance D4. The boundary B2 is opposite to the boundary B1. The processing device 110 may as well determine whether the robot blade 120 is tilted in the front-rear orientation according to a difference between the third distance D3 and the fourth distance D4.

For example, if the third distance D3 is greater than the fourth distance D4, the processing device 110 determines that the robot blade 120 is tilted in the front-rear orientation, and that the robot blade 120 is tilted upward as shown by a tilting type 560 in FIG. 5. If the third distance D3 is less than the fourth distance D4, the processing device 110 still determines that the robot blade 120 is tilted in the front-rear orientation, and that the robot blade 120 is tilted downward as shown by a tilting type 580 in FIG. 5.

Through the difference between the first distance D1 and the second distance D2, and the difference between the third distance D3 and the fourth distance D4, the processing device 110 may confirm in two respects as regards whether the robot blade 120 is tilted, and whether the tilting type is tilting upward or tilting downward.

In this embodiment, a fifth distance D5 is a total length of the sampling area 410 from the boundary B1 to the boundary B2. The processing device 110 may also determine whether the robot blade 120 is tilted leftward or rightward according to a difference D5−(D1+D3) generated by subtracting the first distance D1 and the third distance D3 from the fifth distance D5. In this embodiment, the first pixel coordinate P1 and the third pixel coordinate P3 are both located at the front end of the robot blade 120, and the second pixel coordinate P2 and the fourth pixel coordinate P4 are both located at the rear end of the robot blade 120. More specifically, the first pixel coordinate P1 and the third pixel coordinate P3 may be located at the same length of the robot blade 120 (the same position in the X direction and different positions in the Y direction), and the second pixel coordinate P2 and the fourth pixel coordinate P4 may be located at the same length of the robot blade 120 (the same position in the X direction and different positions in the Y direction). That is, the first pixel coordinate P1 and the third pixel coordinate P3 are on opposite sides of the robot blade 120, and the second pixel coordinate P2 and the fourth pixel coordinate P4 are on opposite sides of the robot blade 120. In other embodiments, nonetheless, the first pixel coordinate P1 and the third pixel coordinate P3 may as well be located at different lengths of the robot blade 120, and the second pixel coordinate P2 and the fourth pixel coordinate P4 may as well be located at different lengths of the robot blade 120.

When the difference D5−(D1+D3) is greater than a threshold value (e.g., with reference to a thickness of the robot blade 120), the processing device 110 determines that the robot blade 120 is tilted in a left-right orientation, as shown by a tilting type 520 or a tilting type 550 in FIG. 5. On the other hand, another difference D5−(D2+D4) may be obtained by subtracting the second distance D2 and the fourth distance D4 from the fifth distance D5. When the difference D5−(D2+D4) is greater than the threshold value, the processing device 110 determines the robot blade 120 is tilted in a left-right orientation, as shown by a tilting type 540 or a tilting type 570 in FIG. 5.

In this embodiment, since the image capturing device 130 captures images from a fixed field of view, and captures images with a fixed size from the monitoring image 400 as the sampling area 410, therefore, the processing device 110 can obtain spatial coordinates corresponding to each pixel coordinate through a lookup table to further determine a position of the robot blade 120 in a space.

The transportation monitoring system 100 may capture a pre-calibrated image from the same fixed field of view in advance. In other words, the pre-calibrated image has the same field of view as that of the monitoring image, and the same capturing range of background. The processing device 110 may create a lookup table based on the pre-calibrated image and known spatial coordinates in the capturing space. A plurality of spatial coordinates are recorded in the lookup table, where the plurality of pixel coordinates of the image captured by the image capturing device 130 correspond to the plurality spatial coordinates.

In this embodiment, a calibration marker may be provided in the capturing background, and a position of the calibration marker provided is within the fixed field of view of the image capturing device 130, so that a content of the monitoring image includes the calibration marker. The processing device 110 may determine whether the fixed field of view is deviated according to the position of the calibration marker in the monitoring image. In the embodiment of FIG. 4, two calibration markers 402 and 404 are employed, but the disclosure does not limit the number of calibration markers. The calibration marker 402 and the calibration marker 404 are provided to appear at positions in diagonal corners of the monitoring image 400. If either of the calibration marker 402 and the calibration marker 404 does not appear in the predetermined position in the monitoring image 400, the processing device 110 or the operator may determine that the capturing angle of the image capturing device 130 is already deviated and calibrate the image capturing device 130 accordingly.

Since the pixel coordinate and the corresponding spatial coordinate are recorded in the lookup table, the processing device 110 may determine in advance which part of the monitoring image 400 is adopted as the sampling area 410. For example, when the robot blade 120 moves to an entrance of the carrier 200, the image capturing device 130 captures the image of the robot blade 120. The processing device 110 may capture only the image at the entrance of the carrier 200 as a sampling range, and the sampling range includes the robot blade 120. In this way, the computational burden during identification of the robot blade 120 is reduced. On the other hand, a pixel length from the robot blade 120 to the boundary of the sampling range can also be easily converted into a spatial distance.

After obtaining the pixel coordinates P1 to P4 of the robot blade 120, the processing device 110 may also determine a spatial position of the robot blade 120 through the lookup table according to at least one of the pixel coordinates P1 to P4, and, according to the determination result, determine whether to adjust the spatial position of the robot blade 120 with respect to the carrier 200. In an embodiment, the field of view from which the image capturing device 130 captures images is constantly set at the entrance of the container 200 and covers heights of the plurality of housing slots 210 to 240. The processing device 110 obtains the height (a position in the Z direction) of the robot blade 120 according to the monitoring image 400, and further determines whether the robot blade 120 can successfully remove the item WA. For example, when the robot blade 120 is about to remove the item WA located in the housing slot 220, if the processing device 110 determines that the robot blade 120 is currently located in front of an opening of the housing slot 240 or that the robot blade 120 is likely to damage the item WA when extending into the container 200, then the processing device 110 changes the height of the robot blade 120, until the processing device 110 determines that robot blade 120 can remove the item WA smoothly.

Notably, in this embodiment, the carrier 200 and the processing device 110 may be in a one-to-one correspondence, but are not limited thereto. With the one-to-one correspondence, each processing device 110 can timely process the image of the robot blade 120 outside each carrier 200, and can determine whether the robot blade 120 is suitable for a transportation operation before the robot blade 120 performs the transportation operation, to achieve a good monitoring effect.

In summary of the foregoing, the transportation monitoring method and the system thereof in the disclosure monitor the status of the robot blade in real time, and, through capturing the monitoring image of the robot blade, determine whether the robot blade is tilted and further determine a tilting type thereof. When the robot blade is found to be tilted, the processing device sends the warning signal to discontinue the robot blade to prevent damage to the item. In addition, through the monitoring image, the processing device also determines whether positioning of the robot blade is correct at the same time, to prevent picking a wrong item or scratching goods during the movement.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A transportation monitoring method, comprising:
    capturing a monitoring image of a robot blade outside a carrier from a fixed field of view by an image sensor, wherein the robot blade is configured to move an item into or out of the carrier;
    obtaining a sampling area from the monitoring image by a processor; and
    determining a tilting state of the robot blade by the processor according to the sampling area,
    wherein the processor sends a warning signal when the processor determines that the robot blade is tilted, and
    wherein the step of determining the tilting state of the robot blade by the processor according to the sampling area of the monitoring image comprises:
        performing an image processing operation to obtain a plurality of grayscale values of the sampling area;
        obtaining at least two pixel coordinates of the robot blade according to the plurality of grayscale values; and
        determining the tilting state of the robot blade according to the at least two pixel coordinates.

2. The transportation monitoring method according to claim 1, wherein the sampling area is a fixed pixel range of the monitoring image.

3. The transportation monitoring method according to claim 1, wherein the step of determining the tilting state of the robot blade by the processor according to the sampling area of the monitoring image further comprises:
    determining a spatial position of the robot blade according to at least one of the at least two pixel coordinates; and
    determining whether to adjust the spatial position of the robot blade with respect to the carrier according to a determination result.

4. The transportation monitoring method according to claim 1, wherein the step of determining the tilting state of the robot blade by the processor according to the sampling area of the monitoring image further comprises:
    calculating at least two distances from the at least two pixel coordinates to a boundary of the sampling area; and
    comparing the at least two distances to determine a tilting type of the robot blade.

5. The transportation monitoring method according to claim 4, wherein the at least two distances comprise a first distance and a second distance, the first distance and the second distance are respectively distances from a first pixel coordinate and a second pixel coordinate on a first surface of the robot blade to the boundary of the sampling area, and it is determined whether the robot blade is tilted in a front-rear orientation according to a difference between the first distance and the second distance, wherein the first pixel coordinate and the second pixel coordinate are respectively located at positions at different lengths of the robot blade.

6. The transportation monitoring method according to claim 5, wherein the at least two distances further comprise a third distance, the third distance is a distance from a third pixel coordinate on a second surface of the robot blade to the boundary of the sampling area, the second surface is opposite to the first surface, and it is determined whether the robot blade is tilted in a left-right orientation according to a difference generated by subtracting the first distance and the third distance from a total length of the sampling area, wherein the first pixel coordinate and the third pixel coordinate are respectively located at a position at a same length of the robot blade.

7. The transportation monitoring method according to claim 1, further comprising:
    capturing a pre-calibrated image from the fixed field of view by the image sensor; and
    creating a lookup table according to the pre-calibrated image, wherein a plurality of spatial coordinates are recorded in the lookup table, and a plurality of pixel coordinates of an image captured by the image sensor correspond to the plurality of spatial coordinates.

8. The transportation monitoring method according to claim 7, further comprising providing a calibration marker, wherein a content of the monitoring image comprises the calibration marker, and the processor determines whether the fixed field of view is deviated according to a position of the calibration marker in the monitoring image.

9. The transportation monitoring method according to claim 1, wherein the step of capturing the monitoring image from the fixed field of view by the image sensor further comprises capturing the monitoring image by the image sensor before the robot blade moves the item out of the carrier.

10. A transportation monitoring system, comprising:
    an image sensor configured to capture a monitoring image of a robot blade outside a carrier from a fixed field of view, wherein the robot blade is configured to move an item into or out of the carrier; and
    a processor electrically connected to the image sensor and the robot blade, the processor being configured to determine a tilting state of the robot blade according to a sampling area of the monitoring image, wherein the processor sends a warning signal when the processor determines that the robot blade is tilted,
    wherein the processor performs an image processing operation to obtain a plurality of grayscale values of the sampling area, obtains at least two pixel coordinates of the robot blade according to the plurality of grayscale values, and determines the tilting state of the robot blade according to the at least two pixel coordinates.

11. The transportation monitoring system according to claim 10, wherein the sampling area is a fixed pixel range of the monitoring image.

12. The transportation monitoring system according to claim 10, wherein the processor further determines a spatial position of the robot blade according to at least one of the at least two pixel coordinates, and determines whether to adjust the spatial position of the robot blade with respect to the carrier according to a determination result.

13. The transportation monitoring system according to claim 10, wherein the processor calculates at least two distances from the at least two pixel coordinates to a boundary of the sampling area, and compares the at least two distances to determine a tilting type of the robot blade.

14. The transportation monitoring system according to claim 13, wherein the at least two distances comprise a first distance and a second distance, the first distance and the second distance are respectively distances from a first pixel coordinate and a second pixel coordinate on a first surface of the robot blade to the boundary of the sampling area, and it is determined whether the robot blade is tilted in a front-rear orientation according to a difference between the first distance and the second distance, wherein the first pixel coordinate and the second pixel coordinate are respectively located at positions at different lengths of the robot blade.

15. The transportation monitoring system according to claim 14, wherein the at least two distances further comprise a third distance, the third distance is a distance from a third pixel coordinate on a second surface of the robot blade to the boundary of the sampling area, the second surface is opposite to the first surface, and it is determined whether the robot blade is tilted in a left-right orientation according to a difference generated by subtracting the first distance and the third distance from a total length of the sampling area, wherein the first pixel coordinate and the third pixel coordinate are respectively located at a position at a same length of the robot blade.

16. The transportation monitoring system according to claim 10, further comprising a calibration marker provided at a calibration position,
wherein a content of the monitoring image comprises the calibration marker, and the processor determines whether the fixed field of view is deviated according to a position of the calibration marker in the monitoring image.

* * * * *